United States Patent [19]
Mitchell

[11] Patent Number: 5,932,065
[45] Date of Patent: Aug. 3, 1999

[54] UNIVERSAL FIXTURE FOR SUPPORTING AND HOLDING POPULATED SIDES OF PRINTED CIRCUIT BOARD ASSEMBLIES DURING PROCESSING

[75] Inventor: Robert Mitchell, Boise, Id.

[73] Assignee: MCMS, Inc., Nampa, Id.

[21] Appl. No.: 08/833,914

[22] Filed: Apr. 10, 1997

[51] Int. Cl.⁶ .................................................. H05K 3/30
[52] U.S. Cl. .............................. 156/556; 29/743; 29/760; 156/562; 156/382; 269/21; 269/299; 269/903
[58] Field of Search .................................... 156/542, 556, 156/562, 382; 29/740, 743, 760; 269/21, 299, 903

[56] References Cited

U.S. PATENT DOCUMENTS

| | | | |
|---|---|---|---|
| 4,127,432 | 11/1978 | Kuwano et al. | 156/297 |
| 4,336,094 | 6/1982 | Mills | 156/299 |
| 4,451,324 | 5/1984 | Ichikawa et al. | 156/562 |
| 4,458,412 | 7/1984 | Dean et al. | 29/740 X |
| 4,527,222 | 7/1985 | Swingley, Jr. | 361/415 |
| 5,067,648 | 11/1991 | Cascini | 228/47 |

*Primary Examiner*—Francis J. Lorin
*Attorney, Agent, or Firm*—Seed and Berry, LLP

[57] ABSTRACT

A universal fixture for holding printed circuit board assemblies during stencil printing and other PCB assembly processes. In one embodiment, a universal printed circuit board holder has a plurality of supports adapted to be moveably connected to a platform of a printed circuit board processing machine. Each support has a connection end for engaging the platform, a support end to support a first side of a printed circuit board populated with components, and an attachment element at the support end to releasably hold the PCB to the support. The connection ends of the supports are moveably attachable to the platform at a plurality of different positions to selectively locate the attachment elements in alignment with support points on the first side of the printed circuit board. Accordingly, the universal printed circuit board holder preferably supports the populated first side of the printed circuit board in a manner that allows the second side to be manipulated by the printed circuit board processing machine.

58 Claims, 4 Drawing Sheets

5,932,065

UNIVERSAL FIXTURE FOR SUPPORTING AND HOLDING POPULATED SIDES OF PRINTED CIRCUIT BOARD ASSEMBLIES DURING PROCESSING

TECHNICAL FIELD

The present invention relates to processing printed circuit board assemblies, and more specifically to supporting a side of a printed circuit board assembly populated with components.

BACKGROUND OF THE INVENTION

Printed circuit board assemblies are used in computers, communications equipment, televisions, and many other products. In a typical printed circuit board assembly, many electrical components are attached to the top and bottom surfaces of a printed circuit board ("PCB"). Since the electronics manufacturing industry is highly competitive, it is important to maximize the through-put of processing PCB assemblies and to securely attach the electrical components to the PCBs.

The manufacturing of PCB assemblies involves many processes, one of which is surface mounting components to PCBs. To surface mount components to a first surface of a PCB, a dispenser deposits a solder paste and/or an adhesive compound onto the first surface of the PCB, and then a pick-and-place machine presses the components against the solder/adhesive. After the first side of the PCB has been populated with components, the PCB is inverted and the process is repeated to surface mount components to the second side of the PCB. The solder/adhesive dispenser is typically a highly accurate stenciling machine, and the pick-and-place machine is typically a turret type device.

The manufacturing issues related to supporting the populated sides of PCB assemblies are best understood in light of the structure and operation of conventional stencil printing machines. Conventional stenciling machines generally have a stencil plate, a movable platform under the stencil plate, and a PCB holder attached to the platform. Conventional stenciling-machines also have two spaced-apart, parallel conveyor tracks to transport the PCB along a conveyor line between the stencil plate and the movable platform. In operation, the conveyor tracks engage opposing edges of the PCB and transport the PCB until it is over the PCB holder, the work platform then moves upwardly to lift the PCB to the stencil plate, and a wiper moves across the stencil plate to press the solder paste or the adhesive compound onto the PCB. After the wiper stops, the work platform moves downwardly from the stencil plate to replace the PCB on the conveyor rails so that it can be transported to a pick-and-place machine.

In addition to maximizing the throughput of processing PCB assemblies, it is also becoming important to accurately fount a large number (e.g., 1000–1500) of very small components to one side of the PCB assemblies. Accordingly, an important aspect of stencil printing on PCBs is to accurately align a PCB with the stencil plate to deposit a pattern of solder/adhesive pads at desired locations on the upwardly facing surface of the PCB. Another important objective of stencil printing PCBs is to hold the PCB flat with respect to the stencil plate so that a desired volume of the solder/adhesive compound is deposited evenly across the upwardly facing surface of the PCB. Thus, it is generally desirable to securely attach the PCB to the PCB holder.

To securely attach the PCB to the PCB holder, conventional PCB holders typically have sidewalls projecting up from the platform to support the perimeter of the PCB, and spacers positioned within the sidewalls to support interior portions of the PCB. A vacuum is drawn within a chamber defined by the platform, the sidewalls and the PCB to securely attach the PCB to the sidewalls and draw the interior portion of the PCB against the spacers. It will be appreciated that the spacers prevent the PCB from bowing into the chamber by holding the PCB flat.

Conventional stenciling machines, however, encounter several manufacturing issues when components are surface mounted to both surfaces of PCB assemblies. Conventional stenciling machines are particularly difficult to operate efficiently in the manufacturing of contract PCB assemblies in which five or more runs of different PCB assemblies with different configurations of components are processed in a short period of time. For example, after the first side of a PCB is populated with components and inverted to stencil print the second side of the PCB, one problem with conventional PCB holders is that the spacers may engage some of the components on the first side of the PCB. To avoid this problem for processing several runs of PCBs with different configurations of components, the spacers are manually attached directly to vacant areas between components on the populated side of each PCB. It will be appreciated that manually attaching the spacers to each PCB is not only time-consuming, but an operator may also fail to attach the spacers to all of the desired support points on the PCB to provide adequate support during processing. Therefore, there is a significant need to quickly and consistently support PCB assemblies with different configurations of components in the manufacturing of contract PCB assemblies.

SUMMARY OF THE INVENTION

The present invention is a universal fixture for holding printed circuit board assemblies during stencil printing and other PCB assembly processes. In one embodiment, a universal printed circuit board holder has a plurality of supports adapted to be moveably connected to a platform of a printed circuit board processing machine. Each support may have a connection end for engaging the platform, a support end to support a first side of a printed circuit board populated with components, and an attachment element at the support end to releasably hold the PCB to the support. The connection ends of the supports are moveably attachable to the platform at a plurality of different positions to selectively locate the attachment elements in alignment with support points on the first side of the printed circuit board. Accordingly, the universal printed circuit board holder may support the populated first side of the printed circuit board in a manner that allows the second side to be manipulated by the printed circuit board processing machine.

In another embodiment, the universal fixture has a base adapted to be attached to a platform of a printed circuit board processing machine, and a plurality of supports adapted to be movably attached to the base. The base may have a plurality of holes through the platform, and each hole may have a first opening adapted to be coupled to a vacuum source and a second opening configured to removably receive a support. The plurality of holes in the base may be configured in a pattern to provide extra holes into which a desired number of supports may be selectively positioned and repositioned to support different printed circuit board assemblies with different configurations of components. The supports may be threaded studs, and each stud may have a fluid passageway or hole extending through the stud from a first port at a connection end of the stud to a second port at a support end of the stud. In operation, the studs are attached to desired holes and the vacuum source draws a vacuum through the studs to securely hold the printed circuit boards to the studs.

The fluid passageways and ports in the studs accordingly define one embodiment of an attachment element in accordance with the invention. The universal printed circuit board holders may provide a plurality of selectively located point contacts to sequentially hold pre-populated sides of printed circuit boards with different configurations of components. To sequentially support different printed circuit board assemblies, a desired number of supports are positioned on the base in a configuration corresponding to a pattern of support points on a populated side of a first printed circuit board assembly with a first configuration of components. After the first printed circuit board assembly is processed, some or all of the supports are selectively repositioned on the base in another configuration corresponding to another pattern of support points on a populated side of a second printed board assembly with a second configuration of components. Accordingly, one embodiment of the universal printed circuit board holder may quickly be configured to hold the pre-populated sides of different printed circuit board assemblies with different configurations of components.

DETAILED DESCRIPTION OF THE INVENTION

The present invention relates to universal printed circuit board holders for supporting printed circuit board assemblies. An aspect of an embodiment of the invention is to provide a base having a plurality of support locations, and to provide a plurality of supports that are adapted to be positioned at the support locations on the base in alignment with support points on the populated side of a printed circuit board assembly. Another aspect of an embodiment of the invention is to provide an attachment element at the top of each support to hold the printed circuit board assembly to the supports. FIGS. 1–6, in which like reference numbers refer to like elements, illustrate embodiments of universal printed circuit board holders in accordance with the invention.

Figure 1:
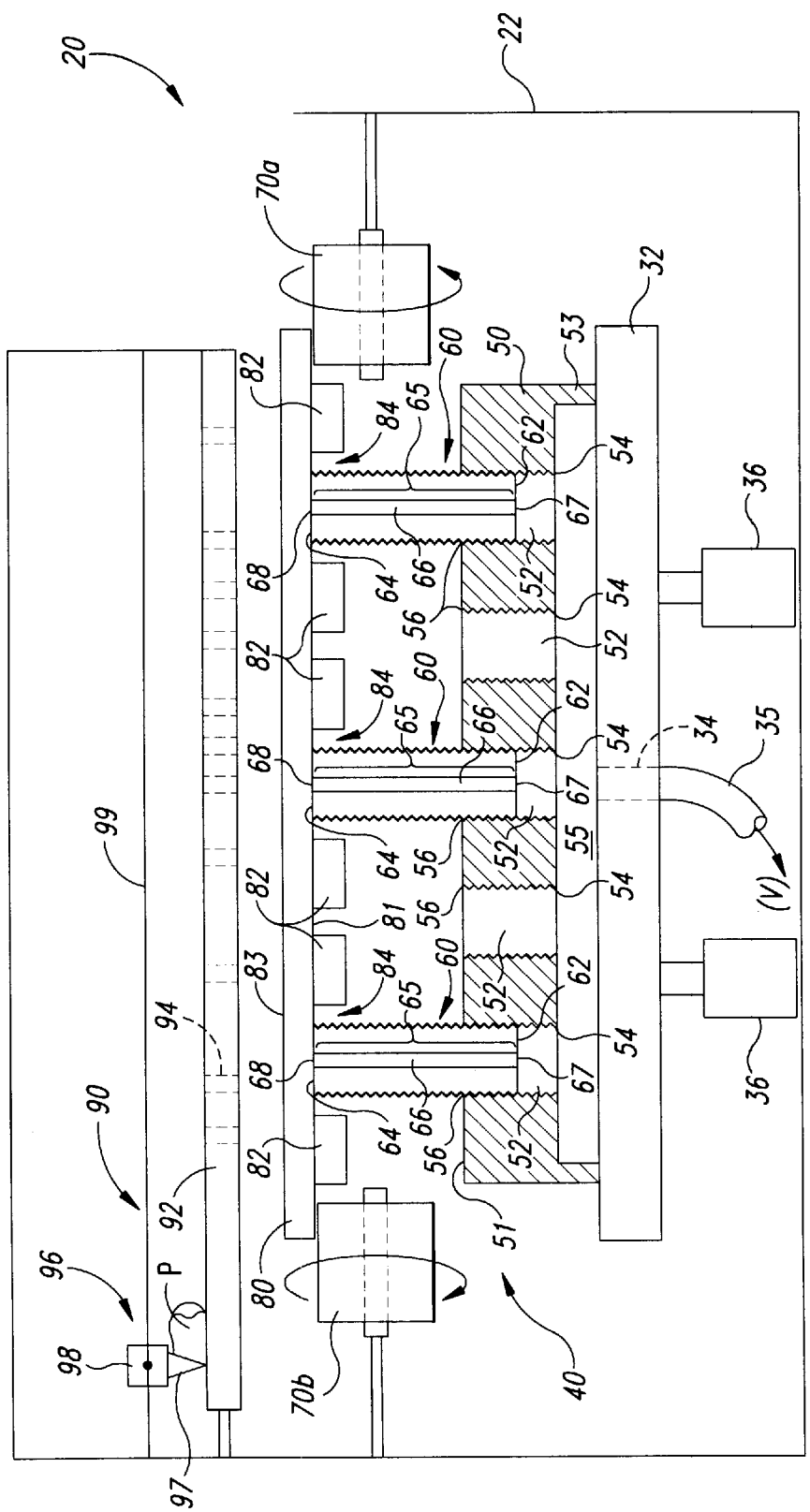
FIG. 1 is a schematic cross-sectional view of an embodiment of a stenciling machine and a universal printed circuit board holder in accordance with the invention.
Figure 2:
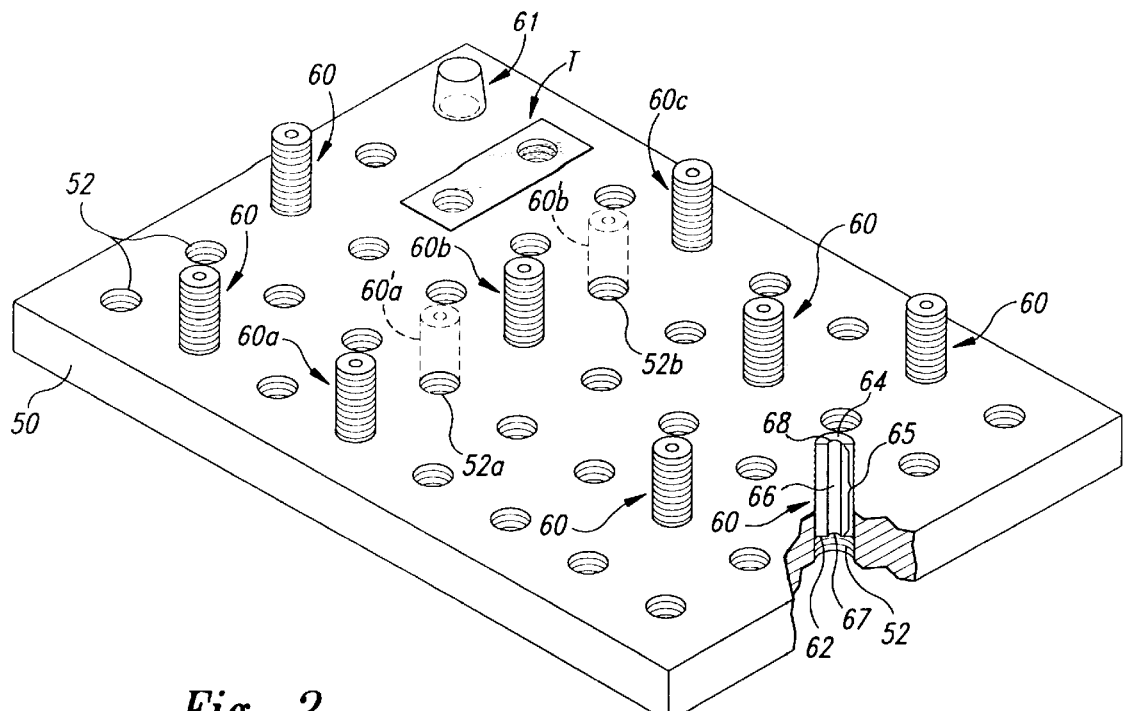
FIG. 2 is an isometric view of an embodiment of a universal printed circuit board holder in accordance with the invention.

FIG. 1 is a schematic cross-sectional view of an embodiment of a stenciling machine 20 in accordance with the invention, and FIG. 2 is an isometric view of an embodiment of a universal PCB holder 40 used in the stenciling machine 20. As shown in FIG. 1, the stenciling machine 20 may have a moveable platform 32 to which the PCB holder 40 is mounted, conveyor tracks 70(a) and 70(b) outside of the PCB holder 40, and a stenciling assembly 90 above the conveyor tracks 70(a) and 70(b). The platform 32 is attached to a number of actuators 36 that raise and lower the platform 32 to lift a PCB 80 into 20 engagement with a stencil plate 92 of the stenciling assembly 90. In one embodiment, the platform 32 has a vacuum port 34 and a vacuum line 35 coupled to a vacuum source V (not shown). The stenciling device 20 may have a housing 22 or other support structure to which the actuators 36, the conveyor tracks 70(a) and 70(b), and the stenciling assembly 90 are attached. One suitable stenciling machine that has a moveable platform 32, conveyor tracks 70(a) and 70(b), and a stenciling assembly 90 is the UltraPrint stenciling machine manufactured by MPM Corporation.

The PCB holder 40 may have a base 50 and a plurality of supports 60 positioned on the base 50. The supports 60 may be movably connected to the base 50 to allow an operator to selectively position the supports 60 to engage support points on a populated first side 81 of the printed circuit board 80. The support points may be vacant areas 84 between components 82 on the first side 81 of the printed circuit board 80, or the support points may be on the surface of some of the components 82. As described in detail below, the supports 60 may be selectively configured and reconfigured on the base 50 to support pre-populated sides of different PCBs with different configurations of components.

The base 50 may be a plate, platform or other type of body 51 with a plurality of holes 52 into which the supports 60 may be selectively positioned. Each hole 52 may have a first end 54 operatively coupled to the vacuum source V and a second end 56 at the top surface configured to receive one the supports 60. The base 50 may have a rim 53 projecting downwardly around the perimeter of the plate 51 to form a cavity 55 between the plate 51 and the platform 32 of the stenciling machine 20. The holes 52 and the cavity 55 define a conduit system in the base 50 that is in fluid communication with the vacuum source V via the vacuum opening 34 and vacuum line 35. The base 50 may have a large number of holes 52 configured into a pattern so that a desired number of supports 60 may be aligned with a desired number of support points on the PCB 80. In one embodiment, the holes 52 are arranged in a matrix of rows and columns of support locations to provide an X-Y coordinate system for positioning individual supports 60 on the base 50. Other embodiments may utilize other conventional coordinate systems, such as a polar coordinate system.

Referring still to FIGS. 1 and 2, the supports 60 may be posts, studs or columns that project upwardly from the base 50. Each support 60 may have a connection end 62 adapted to be received in the holes 52, a support end 64 to engage support points on the first side 81 of the PCB 80, and an attachment element 65 positioned, in part, at the support end 64 to hold the PCB 80 to the support 60. In the embodiment of the supports 60 illustrated in FIGS. 1 and 2, the attachment element 65 is a fluid passageway or hole 66 extending through each support 60 from a first port 67 at the connection end 62 to a second port 68 at the support end 64. When the supports 60 are positioned in the holes 52, the passageways 66 are in fluid communication with the vacuum source V via the holes 52, the cavity 55, the vacuum opening 34 and the vacuum line 35. Accordingly, a vacuum drawn by the vacuum source V creates suction at the second ports 68 to secure the first side 81 of the printed circuit board 80 to the supports 60. To reduce suction loss through the unoccupied holes 52 where there are no supports 60, plugs 61 (FIG. 2) may be inserted into the unoccupied holes 52 or the unoccupied holes 52 may be covered with a flexible material T (e.g., tape) (FIG. 2). In many applications, however, the vacuum may be sufficient to create an adequate suction through the supports 60 without obstructing the unoccupied holes 52.

In an example of the operation of the stenciling machine 20 and the PCB holder 40 shown in FIGS. 1 and 2, a desired number of supports 60 are positioned in selected holes 52 of the base 50 to locate the supports 60 in a pattern corresponding to the location of at least a few of the vacant areas 84 on the first side 81 of the PCB 80. The conveyor tracks 70(a) and 70(b) initially position the PCB 80 over the PCB holder 40 so that each support 60 attached to the base 50 aligns with a corresponding vacant area 84 on the PCB 80. The actuators 36 then raise platform 32 and the PCB holder 40 until the supports 60 engage the vacant areas 84, at which point a vacuum drawn through the passageways 66 via the vacuum source V secures the PCB 80 to the supports 60. The platform 32 raises a second side 83 of the PCB 80 up to the bottom side of the stencil plate 92, and then a wiper assembly 96 of the stenciling assembly 90 sweeps a wiper blade 97 across the stencil plate 92 to drive a paste compound P through holes 94 in the stencil plate 92. The PCB 80 is then returned to the conveyor tracks 70(a) and 70(b) and transported to another processing machine.

To print the solder paste P onto another run of PCB assemblies (not shown) with a different configuration of components, the supports 60 are reconfigured in another pattern corresponding to a pattern of support points on the populated sides of the second PCB assemblies. For example, if the position of some of the support points on the second PCB assemblies correspond to the position of holes 52(a) and 52(b) of the base 50, the supports 60(a) and 60(b) may be moved into holes 52(a) and 52(b) (shown in phantom as supports 60'(a) and 60'(b)). Additionally, if the position of a component on the second PCB assemblies corresponds to the position of the support 60(c), the support 60(c) may be removed from the base 50.

Figure 3:
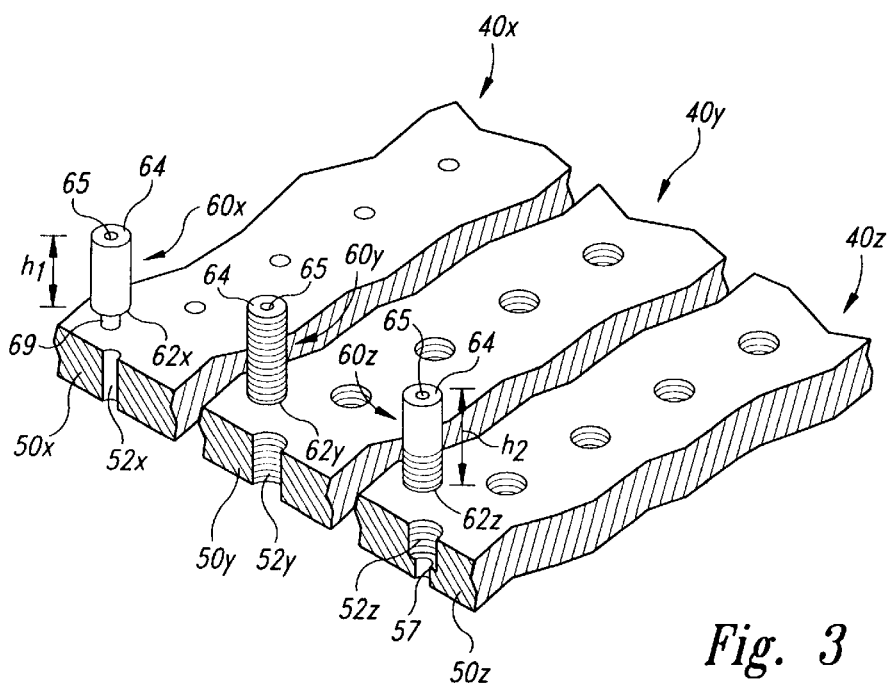
FIG. 3 is a plurality of partial isometric views of a plurality of embodiments of supports and bases of universal printed circuit board holders in accordance with the invention.

FIG. 3 is a partial isometric view of a plurality of embodiments of bases 50 and supports 60 in accordance with the invention. In one embodiment, a PCB holder 40(x) has a base 50(x) and plurality of supports 60(x) moveably connected to the base 50(x) (only one support 60(x) is shown). The base 50(x) has threaded or smooth holes 52(x), and each support 60(x) has a boss 69 projecting longitudinally from a connection end 62(x) of the support 60(x). The holes 52(x) receive the bosses 69 to movably connect the supports 60(x) to the base 50(x). The supports 60(x) may have a height $h_1$ sufficient to space the components (not shown) on the first side of a PCB (not shown) apart from the base 50(x). When a plurality supports 60(x) engage vacant areas on the PCB between components, all of the supports 60(x) may have a uniform height to hold the PCB flat. In some applications, however, it may be necessary to support a PCB at a location occupied by a component. The height of the supports 60(x), therefore, may vary to provide supports that project from the base 50(x) to an elevation corresponding to the surface of the component.

In another embodiment shown in FIG. 3, a PCB holder 40(y) has a base 50(y) and a plurality of threaded supports or studs 60(y) moveably attached to the base 50(y) (only one stud 60(y) is shown). The threaded supports 60(y) threadedly engage holes 52(y) in the base 50(y) to selectively position the supports 60(y) on the base 50. Additionally, the height of the supports 60(y) with respect to the base 50(y) is adjusted by rotating the supports 60(y) within the holes 52(y). The height of the supports 60(y) relative to the base 50(y) may accordingly be adjusted to desired elevations to engage support points on the populated side of a PCB, including vacant areas or components. The specific height of the supports 60(y) may be controlled with a caliper or other type of conventional measuring device.

In still another embodiment illustrated in FIG. 3, a PCB holder 40(z) has a base 50(z) and a plurality of supports 60(z) moveably connected to the base 50(z) (only one support 60(z) is shown). The base 50(z) may have holes 52(z) with threads from the top surface of the base 50(z) to a stop 57 at an intermediate depth within the base 50(z). The remainder of each hole 52(z) is either threaded or smooth depending upon the specific application. The supports 60(z) may have a height $h_2$ sufficient to space a PCB apart from the surface of the base 50(z) when the supports 60(z) engage the stops 57 of the holes 52(z). As with the supports 60(x), the height of the supports 60(z) may be varied according to the specific application to provide the desired spacing between the PCB and the top surface of the base 50(z), or to support the PCB under a component on the PCB. The embodiments of PCB holders 40, and more specifically the bases 50 and supports 60 illustrated in FIGS. 1–3, represent some of the embodiments of PCB holders in accordance with the invention. Thus, in the embodiments of the invention shown in FIG. 3, the supports 60 are movably connected to the base 50 at a plurality of different positions to selectively locate the supports 60 in alignment with desired support areas on the populated sides of the PCBs.

One advantage of the embodiment of the universal PCB holder 40 shown in FIG. 1 is that it securely holds a populated side of a PCB so that the PCB is accurately positioned within a processing machine. The embodiment of the universal PCB holder 40 engages attachment elements 65 with vacant areas or other support points on the populated side of a PCB to securely hold the PCB in place during processing. Additionally, by adjusting the heights of the supports 60 with respect to the base 50, the PCB may even be supported under components on the populated side of the PCB.

Another advantage of this embodiment of the universal PCB holder 40 is that it may be reconfigured to support the populated sides of a plurality of different printed circuit boards with different configurations of components. As discussed above in the background section, conventional processes manually attach spacers to vacant areas between components on the populated side of each PCB, and then the PCB is placed on the conventional PCB holder. Accordingly, each PCB in a run of like PCBs is handled manually, which is time-consuming and reduces throughput of PCB assembling processes. In the embodiment of the universal PCB holder 40 shown in FIG. 1, however, the supports 60 are configured on the base 50 only once for a run of PCB assemblies with a first design. Similarly, the supports 60 may be reconfigured only once for another run of PCB assemblies with a second design. Therefore, the universal PCB holder 40 may reduce the downtime associated with stencil printing or performing other processes on runs of PCB assemblies.

Still another advantage of the embodiment of the universal PCB holder 40 shown in FIG. 1 is that it improves the accuracy of stencil printing on the PCB assemblies. Conventional devices and methods for supporting the populated sides of PCBs may not adequately support all of the areas on a PCB assembly because the operator may not attach the spacers to appropriate locations on the PCB to adequately support the PCB. In this embodiment of the PCB holder 40, however, predetermined coordinates for the supports 60 may be supplied to an operator so that the positions of the supports 60 are not merely estimates of the best support positions determined on trial-and-error basis. It will be appreciated that supports 60 located at the predetermined coordinates are more likely to adequately support PCBs than the manual, random attachment of spacers used in conventional methods and devices. Therefore, the embodiment of the universal PCB holder 40 shown in FIG. I consistently and accurately supports the populated sides of different PCB assemblies.

Figure 4:
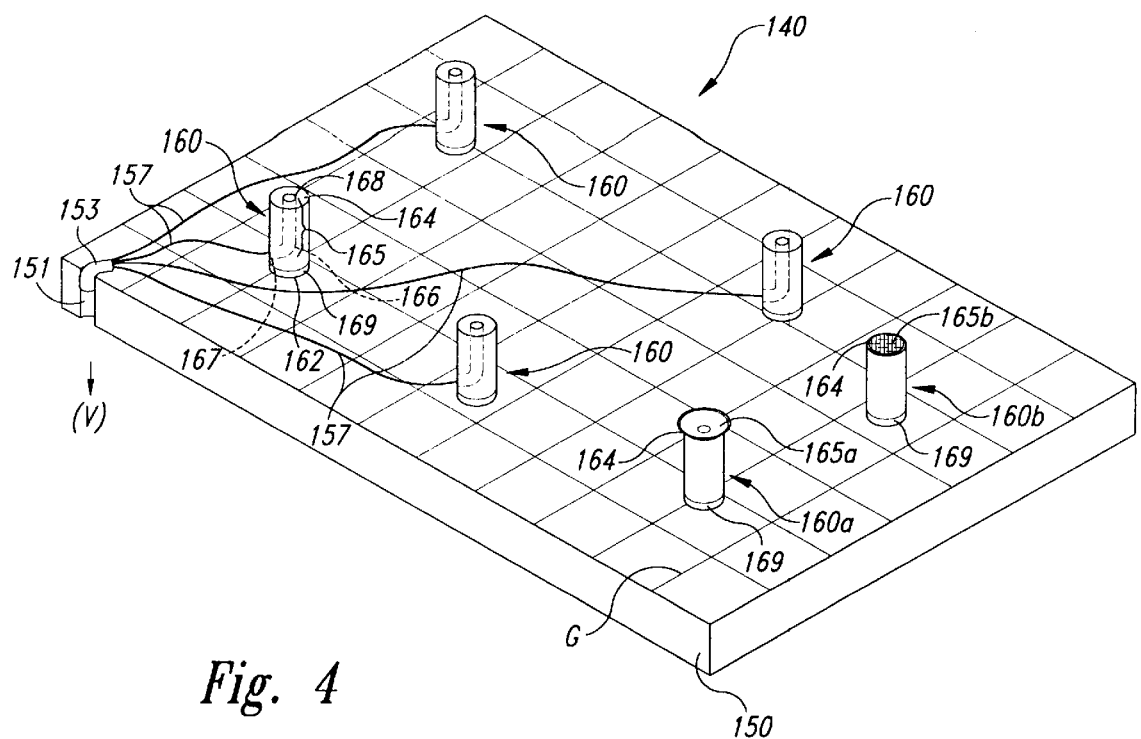
FIG. 4 is an isometric view of another embodiment of a universal printed circuit board holder in accordance with the invention.

FIG. 4 is an isometric view of another embodiment of a PCB holder 140 with a base 150 and a plurality of supports 160 movably positioned on the base 150. The base 150 preferably has a conduit system with a hole 151 coupled to a vacuum source V, a fitting 153 coupled to the hole 151, and a plurality of fluid lines 157 coupled to the fitting 153. Each support 160 has an attachment element 165, which is preferably a suction device, an adhesive, or another type of fastener. In one embodiment of the PCB holder 140 (shown by supports 160), the attachment element 165 is a passageway 166 with a first port 167 coupled to one of the lines 157 and a second port 168 at a support end 164 of the support 160. In other embodiments, an attachment element 165a may be a suction cup attached to the support end 164 (indicated by support 160(a)). Alternatively, attachment element 165b may be a detachable adhesive on the support end 164 (indicated by support 160(b)).

In the operation of the PCB holder 140, the supports 160 may be moved to positions on the surface 151 of the base 150 to selectively locate the support ends 164 of the supports 160 where the attachment elements 165 can engage vacant areas or other support points on the populated sides of printed circuit boards with different configurations of components. In one embodiment, a reference grid G is printed or otherwise formed on the surface of the base 150 to provide a reference coordinates for positioning the supports 160 at desired locations. Additionally, a magnet 169 or other type of releasable connecting device may be attached to the connection end 162 of the supports 160 to releasably connect the supports 160 to the base 150.

Figure 5:
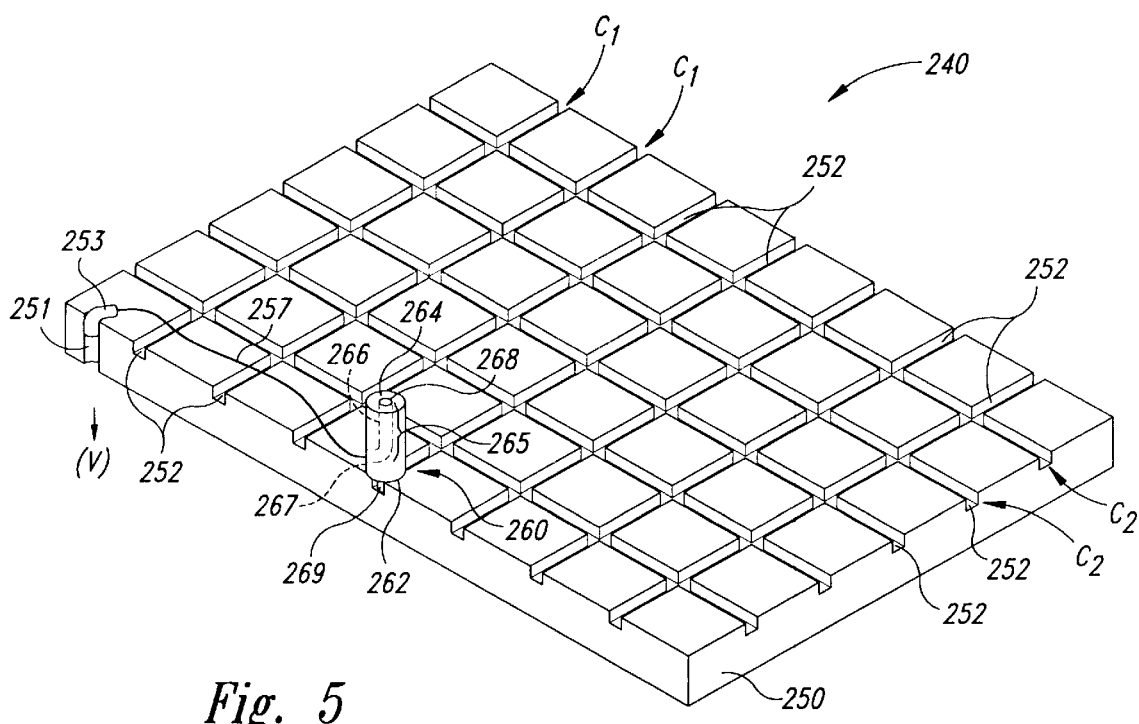
FIG. 5 is an isometric view of still another embodiment of a universal printed circuit board holder in accordance with the invention.

FIG. 5 is an isometric view of another embodiment of a universal PCB holder 240 that has a base 250 with a plurality of guide members 252, and a plurality of supports 260 moveably connected to the base 250 (only one support 260 is shown). In one embodiment, the guide members 252 are channels $C_1$ that extend substantially parallel to each other across a first dimension of the base 250. The guide members 252 also may have a plurality of channels $C_2$ extending across another dimension of the base 250 to form a grid of channels. The base 250 also may have a conduit system with a hole 251 through the base 250, a fitting 253 attached to the hole 251, and lines 257 coupled to the fitting 253 (only one line 257 is shown). Each support 260 may have a connection end 262, a boss 269 projecting from the connection end 262, a support end 264, and an attachment element 265 at the support end 264. As discussed above, the attachment element 265 may be a fluid passageway 266 with a first port 267 coupled to one of the lines 257 and a second port 268 positioned at the connection end 264. To position the supports 260 at desired locations, an operator inserts or slides the supports 260 along the channels $C_1$ or $C_2$ to desired locations.

Figure 6:
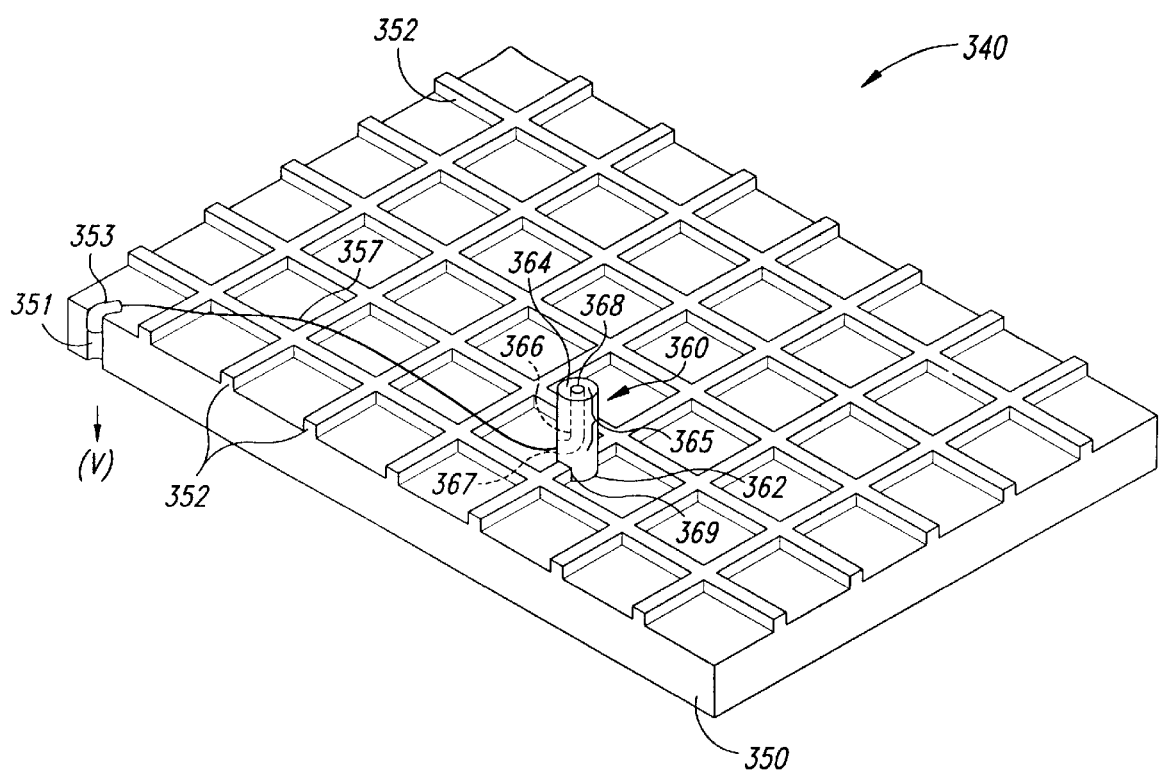
FIG. 6 is an isometric view of yet another embodiment of a universal printed circuit board holder in accordance with the invention.

FIG. 6 is an isometric view of another embodiment of a universal PCB holder 340 that has a base 350 with a plurality of guide members 352, and a plurality of supports 360 moveably connected to the base 350 (only one support 360 is shown). In the embodiment shown in FIG. 6, the guide members 352 are rails $R_1$ and $R_2$ extending across different dimensions of the base 350. The guide members 352, however, may be nodules (not shown) or other any suitable raised features on the surface of the base 350. The base 350 also may have a conduit system with a hole 351 operatively connected to a vacuum source V, a fitting 353 coupled to the hole 351, and fluid lines 357 coupled to the fitting 353 (only one fluid line 357 is shown). Each support 360 preferably has a recess 369 to receive one of the guide members 352, and each support 360 may have an attachment element 365 defined by a fluid passageway 366 and first and second ports 367 and 368. The recess 369 in each support 360 may be a slot when the guide members 352 are rails, or the recesses may be depressions (not shown) when the guide members are nodules.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A universal printed circuit board holder for supporting sides of printed circuit board assemblies populated with components, comprising:

a platform over which the printed circuit board assemblies are held during processing; and a plurality of supports projecting upwardly from the platform by a height, each support having a connection end configured to engage the platform and a support end configured to engage an underside of a printed circuit board assembly at an interior support area spaced inwardly from a perimeter of the printed circuit board assembly, wherein the connection ends of the supports are moveably attachable to the platform at a plurality of different positions to selectively configure the supports in a desired pattern corresponding to a pattern of support areas on the populated side of a printed circuit board assembly.

2. The holder of claim 1 wherein each support has a fluid passage way through at least a portion of the support, a first port operatively coupled to a vacuum source, and a second port open at the support end of the corresponding support.

3. The holder of claim 1 wherein the platform has a conduit system comprising a plurality of holes through the platform, each hole having a first opening adapted to be coupled to a vacuum source and a second opening configured to receive the supports, wherein the supports may be selectively positioned and repositioned in the holes to configure the supports in the desired patterns.

4. The holder of claim 3 wherein:

the supports are threaded studs, and each stud has a fluid passage way extending from a first port proximate to the connection end of the stud to a second port proximate to the support end of the stud, and the conduit system comprises a plurality of threaded holes through the platform, each hole having a first opening adapted to be coupled to the vacuum source and a second opening configured to threadedly receive the connection end of a stud.

5. The holder of claim 3 wherein:

the supports are threaded studs having a first set of studs with a first length and a second set of studs with a second length, and each stud has a fluid passage way extending from a first port proximate to the connection end of the stud to a second port proximate to a support end of the stud; and the conduit system comprises a plurality of threaded holes through the platform, each hold having a first opening adapted to be coupled to the vacuum source, a second opening configured to threadedly receive the connection ends of the supports, and a stop between the first and second openings to engage the connection ends of the studs, wherein the height of the studs may be adjusted from a first height of the first set of studs to a second height of the second set of studs by interchanging the first studs with the second studs.

6. The holder of claim 3 wherein:

each support has a boss projecting from the connection end and a fluid passage way extending from a first port at the boss to a second port at the support end of the support; and the conduit system comprises a plurality of holes through the platform, each hole having a first opening adapted to be coupled to the vacuum source and a second opening configured to receive a boss of a support.

7. The holder of claim 1 wherein each support further comprises an attachment element at the support end of the support.

8. The holder of claim 7 wherein the attachment element comprises a suction cup.

9. The holder of claim 7 wherein the attachment element comprises a detachable adhesive.

10. The holder of claim 1 wherein the supports are moveably attachable to the platform separate from the printed circuit board assemblies prior to positioning the printed circuit board assemblies over the platform.

11. A universal printed circuit board holder for supporting sides of printed circuit board assemblies populated with components, comprising:

a platform adapted to be attached to a work station of a processing machine; and at least one support projecting upwardly from the platform to hold the printed circuit board assemblies over the platform, the support having a first end, a second end, and an attachment element positioned at least in part at the second end, the first end of the support being positionable on the platform to selectively locate the support at a position where the attachment element can engage a desired interior support area on a populated side of a first printed circuit board assembly spaced inwardly from a perimeter of the first printed circuit board assembly, and the support member being repositionable on the platform to selectively relocate the support at another position where the attachment element can engage a different desired support area on a populated side of a second printed circuit board assembly with a different configuration of components than the first printed circuit board assembly.

12. The holder of claim 11 wherein the platform comprises a conduit system adapted to be coupled in fluid communication with a vacuum source, and the attachment element comprises a fluid passage way through at least a portion of the support with a first port operatively coupled to the conduit system and a second port open at the second end of the support, wherein the vacuum source generates a suction at the second port of the support to hold the printed circuit board assemblies to the support.

13. The holder of claim 12 wherein the conduit system comprises a hose coupled between the vacuum source and the first port of the support.

14. The holder of claim 12 wherein the conduit system comprises a plurality of holes through the platform, each hole having a first opening adapted to be coupled to the vacuum source and a second opening configured to receive the first end of the support.

15. The holder of claim 12 wherein:

the support is a threaded stud and the fluid passage way is a hole extending through the stud from the first port to the second port; and the conduit system comprises a plurality of threaded holes through the platform, each hole having a first opening adapted to be coupled to the vacuum source and a second opening configured to threadedly receive the first end of the stud wherein the height of the stud may be adjusted by rotating the stud within a hole.

16. The holder of claim 12 wherein:

the support comprises a plurality of threaded studs, and the conduit system comprises a plurality of threaded holes through the platform, each hole having a first opening adapted to be coupled to the vacuum source, a second opening configured to threadedly receive a stud, and a stop between the first and second openings to engage a stud, wherein the height of the stud may be controlled by selecting a stud having a desired length and screwing the stud into a selected hole until the stud engages the stop.

17. The holder of claim 11 wherein:

the support comprises a plurality of posts, and each post has a boss projecting from a first end of the post;

the attachment element comprises a fluid passageway with a hole extending from a first port at the boss to a second port at the second end of the support; and the conduit system comprises a plurality of holes through the platform, each hole having a first opening adapted to be coupled to the vacuum source and a second opening configured to receive a boss.

18. The holder of claim 11 wherein the platform further comprises a plurality of guide members at the surface of the platform, and wherein the first end of the support engages the guide members to be positioned at desired locations on the platform.

19. The holder of claim 18 wherein a boss projects from the first end of the support, and wherein the guide member comprise a plurality of channels shaped to receive the boss.

20. The holder of claim 19 wherein the plurality of channels extend at least substantially parallel to each other across a first dimension of the platform.

21. The holder of claim 19 wherein the platform further comprises a conduit system adapted to be coupled in fluid communication with a vacuum source, and the attachment element comprises a fluid passage way through at least a portion of the support with a first port operatively coupled to the conduit system and a second port open at the second end of the support, and wherein the vacuum source generates a suction at the second port of the support.

22. The holder of claim 19 wherein the attachment element comprises a suction cup.

23. The holder of claim 19 wherein the attachment element comprises an adhesive.

24. The holder of claim 18 wherein the first end of the support has a recess, and wherein the guide members comprise a plurality of raised features projecting from the platform and shaped to be received in the recess of the support.

25. The holder of claim 24 wherein the plurality of raised features comprise a plurality of rails extending across the platform, and wherein the recess in the first end of the support is a slot shaped to receive a rail.

26. The holder of claim 24 wherein the plurality of raised features comprise a plurality of nodules arranged on the surface of the platform and the recess in the first end of the support is a depression shaped to receive the nodules.

27. A universal printed circuit board holder for supporting a side of a printed circuit board assembly populated with components, comprising:

a base with a plurality of support stations, the base being adapted to be attached to a work station of a processing machine; and a plurality of spacers, each spacer having a first end, a second end, and a passage way open at the second end and extending towards the first end through at least a part of the spacer, the spacers being selectively positionable at desired support stations to locate the spacers under desired support areas of the populated side of the printed circuit board assembly, and the passage way being adapted to be coupled to a vacuum source to create a suction at the second ends of the spacers.

28. The holder of claim 27 wherein the base comprises a conduit system adapted to be coupled in fluid communication with the vacuum source and the passageways of the spacers.

29. The holder of claim 28 wherein the conduit system comprises a plurality of hoses, each hose being adapted to be coupled to the vacuum source and passageway of a spacer.

30. The holder of claim 29 wherein the conduit system comprises a plurality of holes through the base, each hole having a first opening adapted to be coupled to the vacuum source and a second opening configured to removably receive a first end of a spacer.

31. A universal printed circuit board holder for supporting a populated side of a printed circuit board assembly, comprising:

a body having a surface and a conduit system, the conduit system being adapted to be coupled in fluid communication with a vacuum source and the body being adapted to be received in a printed circuit board processing machine; and a plurality of posts moveably attachable to the body at selected locations to configure the posts in a pattern corresponding to a pattern of desired support areas on the populated side of the printed circuit board assembly, each post having a support face and a fluid line extending from an opening at the support face to a port adapted to be operatively coupled to the conduit system of the base, wherein the vacuum source creates a suction at the openings of the posts to hold the printed circuit board assembly to the support faces of the posts.

32. The holder of claim 31 wherein the conduit system comprises a plurality of hoses, each hose being coupled to the vacuum source and a port of a post.

33. The holder of claim 31 wherein the conduit system comprises a plurality of holes through the body, each hole having a first opening adapted to be coupled to the vacuum source and a second opening configured to removably receive a post, and the plurality of holes being configured in a pattern on the platform to provide extra holes into which the posts may be repositioned to support a populated side of another printed circuit board assembly with a different configuration of components.

34. The holder of claim 31 wherein:

the posts are threaded studs, and each fluid line is a hole extending through a corresponding stud; and the conduit system comprises a plurality of threaded holes through the body, each hole having a first opening adapted to be coupled to the vacuum source and a second opening configured to threadedly receive a stud.

35. The holder of claim 31 wherein:

each post has a connection end and a boss projecting from the connection end along a longitudinal axis of the post;

each fluid line extends from a port at the boss to the opening at the support face; and the conduit system comprises a plurality of holes through the platform, each hole having a first opening adapted to be coupled to the vacuum source and a second opening configured to receive a boss of a post.

36. The holder of claim 31 wherein the body further comprises a plurality of guide members at a surface of the body, and wherein the posts engage the guide members to be positioned at desired locations on the body.

37. The holder of claim 36 each post has a boss and the guide members comprise a plurality of channels shaped to receive the bosses of the posts.

38. The holder of claim 37 wherein the plurality of channels comprises a plurality of first channels extending at least substantially parallel to each other across a first dimension of the platform and a plurality of second channels extending at least substantially parallel to each other across a second dimension of the platform.

39. The holder of claim 36 wherein each post has a recess and the guide members comprise a plurality of raised features configured in a pattern on the surface of the platform and shaped to be received in a recess of a post.

40. The holder of claim 39 wherein the plurality of raised features comprise a plurality of first rails extending at least substantially parallel to each other across a first dimension of the platform and a plurality of second rails extending at least substantially parallel to each other across a second dimension of the platform, and wherein the recess in the first end of the support is a slot shaped to receive the rails.

41. An apparatus for stenciling paste on top sides of printed circuit board assemblies after bottom sides of the printed circuit board assemblies have been populated with components, comprising:

a stencil assembly having a stencil plate with a plurality of holes arranged in a desired pattern and a moveable wiper to press the paste through the holes;

a moveable platform positioned under the stencil plate, the moveable platform having a surface facing a bottom side of the stencil plate, and the moveable platform being moveable into a raised position to present the top sides of the printed circuit board assemblies to the bottom side of the stencil plate and into a lowered position to remove the top sides of the printed circuit board assemblies from the bottom side of the stencil plate;

a base removeably attached to the platform; and a plurality of supports projecting upwardly from the base to support the printed circuit board assemblies over the base, the supports being configured to engage interior support areas on the bottom side of a printed circuit board assembly that are spaced inwardly from the perimeter of the printed circuit board assembly, and the supports being moveably attached to the base, wherein the supports are positionable on the base to selectively configure the supports in patterns corresponding to patterns of desired support areas on the bottom sides of printed circuit board assemblies with different configurations of components.

42. The apparatus of claim 41 wherein the base further comprises a conduit system adapted to be coupled in fluid communication with a vacuum source, and each support further comprises an attachment element having a fluid passage way through at least a portion of the support, a first port operatively coupled to passageway and the conduit system, and a second port coupled to the passageway and open at the second end of the support, wherein the vacuum source generates a suction at the second ports of the supports to hold the printed circuit board assemblies to the supports.

43. The apparatus of claim 42 wherein the conduit system comprises a plurality of hoses, each hose being coupled to the vacuum source and a first port of a support.

44. The apparatus of claim 42 wherein the conduit system comprises a plurality of holes through the base and a rim projecting downwardly from the base to form a cavity defined by the platform, the rim, and the base, each hole having an opening configured to removably receive a support, and the plurality of holes being configured in a pattern on the platform to provide extra holes into which the supports may be reconfigured into a desired pattern.

45. The apparatus of claim 42 wherein:
the supports are threaded studs, and
the conduit system comprises a plurality of threaded holes through the base.

46. The apparatus of claim 41 wherein:
the supports are columns, and each column has a boss projecting away from the column along a longitudinal axis of the column, and
the conduit system comprises a plurality of holes through the base, each hole having a first opening adapted to be coupled to a vacuum source, and a second opening configured to receive a boss of a support.

47. The apparatus of claim 41 wherein each support further comprises an attachment element to hold the printed circuit board assemblies to the supports.

48. The apparatus of claim 47 wherein the attachment element is a suction cup.

49. The apparatus of claim 47 wherein the attachment element is a detachable adhesive.

50. The apparatus of claim 41 wherein the base further comprises a plurality of guide members at a top surface of the base, and the supports are adapted to engage the guide members.

51. The apparatus of claim 50 wherein each support has a boss projecting from an end and the guide members comprise a plurality of channels shaped to receive the bosses.

52. The apparatus of claim 51 wherein the plurality of channels comprises a plurality of first channels extending at least substantially parallel to each other across a first dimension of the platform and a plurality of second channels extending at least substantially parallel to each other across a second dimension of the platform.

53. The apparatus of claim 50 wherein each support has a recess and the guide members comprise a plurality of raised features configured in a pattern on the platform and shaped to be received in the recesses of the supports.

54. The apparatus of claim 53 wherein the plurality of raised features comprise a plurality of rails extending the base and wherein the recesses in the supports are slots shaped to receive the rails.

55. The apparatus of claim 54 wherein the plurality of raised features comprise a plurality of nodules arranged in rows and columns on the bases and the recess in the supports are depressions shaped to receive the nodules.

56. An apparatus for stenciling paste on top sides of printed circuit board assemblies after bottom sides of the printed circuit board assemblies have been populated with components, comprising:
a stencil assembly having a stencil plate with a plurality of holes arranged in a desired pattern and a moveable wiper to press the paste through the holes;
a moveable platform positioned under the stencil plate, the platform having a surface facing bottom side of the stencil plate and a conduit system adapted to be coupled in fluid communication with a vacuum source, and the moveable platform being moveable into a raised position to present the top sides of the printed circuit board assemblies to the bottom side of the stencil plate and into a lowered position to remove the top sides of the printed circuit board assemblies from the bottom side of the stencil plate; and
a plurality of posts moveably attachable to the platform at selected locations to configure the posts in patterns corresponding to patterns of desired support points on the bottom sides of the printed circuit board assemblies, each post having a support face and a passage way with an opening at the support face, and each passage way being operatively coupled to the conduit system of the platform to be in fluid communication with the vacuum source, wherein the vacuum source draws a vacuum through the conduit and the posts to hold the support points of the printed circuit board assemblies to the support faces of the posts.

57. The apparatus of claim 56 wherein the conduit system comprises a plurality of holes through the platform, each hole having a first opening adapted to be coupled to the vacuum source and a second opening configured to removably receive a support, and the plurality of holes being configured in a pattern on the platform to provide extra holes into which the supports may be reconfigured into a desired pattern.

58. The apparatus of claim 57 wherein:
the supports are threaded studs, and
the conduit system comprises a plurality of threaded holes through the platform, each hole being configured to threadedly receive a stud.

* * * * *